United States Patent
Goto et al.

(10) Patent No.: US 11,876,503 B2
(45) Date of Patent: Jan. 16, 2024

(54) RESONANCE DEVICE

(71) Applicant: Murata Manufacturing Co., Ltd., Nagaokakyo (JP)

(72) Inventors: Yuichi Goto, Nagaokakyo (JP); Keisuke Takeyama, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 591 days.

(21) Appl. No.: 17/164,287

(22) Filed: Feb. 1, 2021

(65) Prior Publication Data

US 2021/0159884 A1    May 27, 2021

Related U.S. Application Data

(63) Continuation of application No. PCT/JP2019/010016, filed on Mar. 12, 2019.

(30) Foreign Application Priority Data

Aug. 22, 2018  (JP) .................. 2018-155469

(51) Int. Cl.
*H03H 9/10* (2006.01)
*H03H 9/24* (2006.01)

(52) U.S. Cl.
CPC ........ *H03H 9/2457* (2013.01); *H03H 9/1057* (2013.01)

(58) Field of Classification Search
CPC .......................... H03H 9/1057; H03H 9/2457
USPC ......................................... 310/370
See application file for complete search history.

(56) References Cited

U.S. PATENT DOCUMENTS

2019/0089321 A1    3/2019  Morinaga

FOREIGN PATENT DOCUMENTS

WO        2017212677 A1    12/2017

OTHER PUBLICATIONS

International Search Report Issued for PCT/JP2019/010016, dated Jun. 11, 2019.
Written Opinion of the International Searching Authority issued for PCT/JP2019/010016, dated Jun. 11, 2019.

*Primary Examiner* — Derek J Rosenau
(74) *Attorney, Agent, or Firm* — ArentFox Schiff LLP (57) ABSTRACT

A resonance device that includes a lower cover, an upper cover joined to the lower cover, a resonator having vibrating arms that bend and vibrate in a vibration space between the lower cover and the upper cover, and particles attached to tip portions of the vibrating arms. When a median size of the particle is defined as D50, a specific gravity of the particle is defined as A, and a resonant frequency of the resonator is defined as X, $D50 \leq 189/(X \times \sqrt{A})$.

16 Claims, 9 Drawing Sheets

RESONANCE DEVICE

CROSS REFERENCE TO RELATED APPLICATIONS

The present application is a continuation of International application No. PCT/JP2019/010016, filed Mar. 12, 2019, which claims priority to Japanese Patent Application No. 2018-155469, filed Aug. 22, 2018, the entire contents of each of which are incorporated herein by reference.

FIELD OF THE INVENTION

The present invention relates to a resonance device.

BACKGROUND OF THE INVENTION

In electronic devices such as smartphones, a resonance device, which is a type of Micro-Electro-Mechanical Systems (MEMS), is incorporated as a timing device, for example. Such a resonance device includes, for example, a lower substrate, an upper substrate that forms a cavity between the lower substrate and the upper substrate, and a resonator arranged in the cavity between the lower substrate and the upper substrate.

A method of manufacturing an existing resonance device includes a process of adjusting a resonant frequency of a resonator. For example, Patent Document 1 discloses a method for manufacturing a resonance device that includes a process of adjusting a frequency of a resonator by exciting a vibrating arm that bends and vibrates and causing a part of the vibrating arm to collide with at least one of a lower cover and an upper cover, and thus, the resonant frequency can be adjusted without impairing piezoelectricity of the resonator.

Patent Document 1: International Publication No. 2017/212677

SUMMARY OF THE INVENTION

However, in the manufacturing method described in Patent Document 1, particles scraped off from the vibrating arm are attached to the vibrating arm due to the collision of the vibrating arm with the upper cover or the lower cover in the frequency adjusting process. When the particles attached during the vibration of the resonator fall off from the vibrating arm, the resonant frequency of the resonator fluctuates.

The present invention has been made in view of such circumstances, and an object of the present invention is to provide a resonance device capable of suppressing a fluctuation in resonant frequency.

A resonance device according to an aspect of the present invention includes a lower cover; an upper cover joined to the lower cover; a resonator having a vibrating arm that bends and vibrates in a vibration space between the lower cover and the upper cover; and a particle attached to a tip portion of the vibrating arm, wherein when a median size of the particle is defined as D50, a specific gravity of the particle is defined as A, and a resonant frequency of the resonator is defined as X, $D50 \leq 189/(X \times \sqrt{A})$.

According to the present invention, it is possible to provide a resonance device capable of suppressing a fluctuation in resonant frequency.

DETAILED DESCRIPTION OF THE PREFERRED EMBODIMENTS

Hereinafter, an embodiment of the present invention will be described with reference to the accompanying drawings. In the following description of the drawings, the same or similar components are denoted by the same or similar reference numerals. The drawings are illustrative, and the dimensions and shapes of the respective parts are schematic and should not be construed as limiting the technical scope of the present invention to the embodiment.

Embodiment

Figure 1:
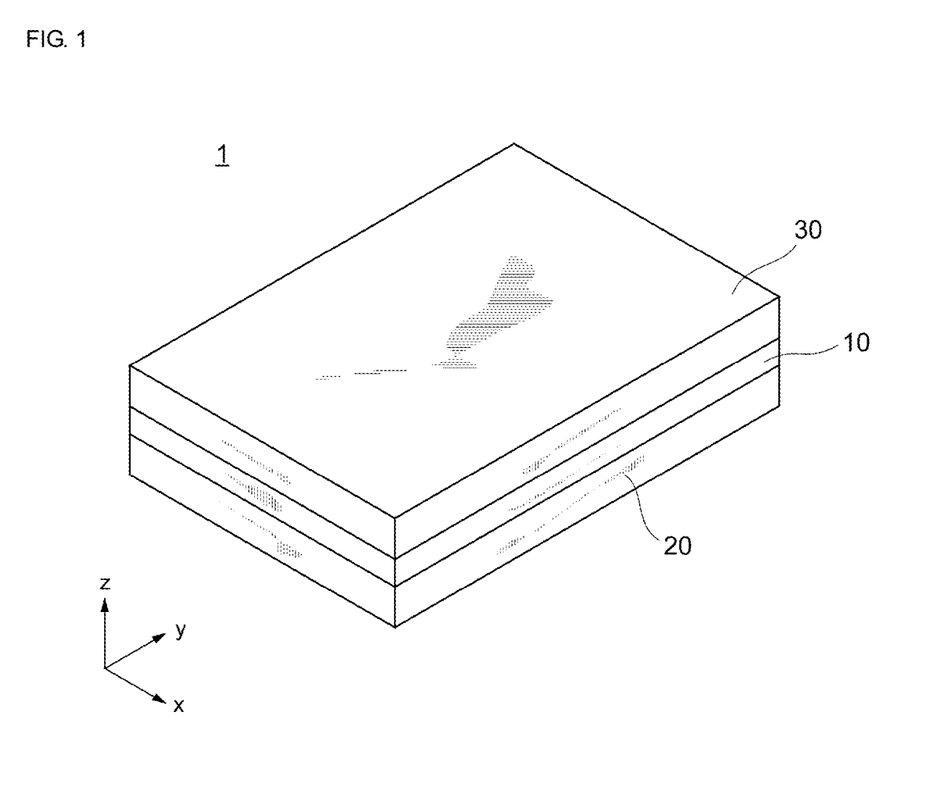
FIG. 1 is a perspective view schematically illustrating an appearance of a resonance device according to an embodiment of the present invention.
Figure 2:
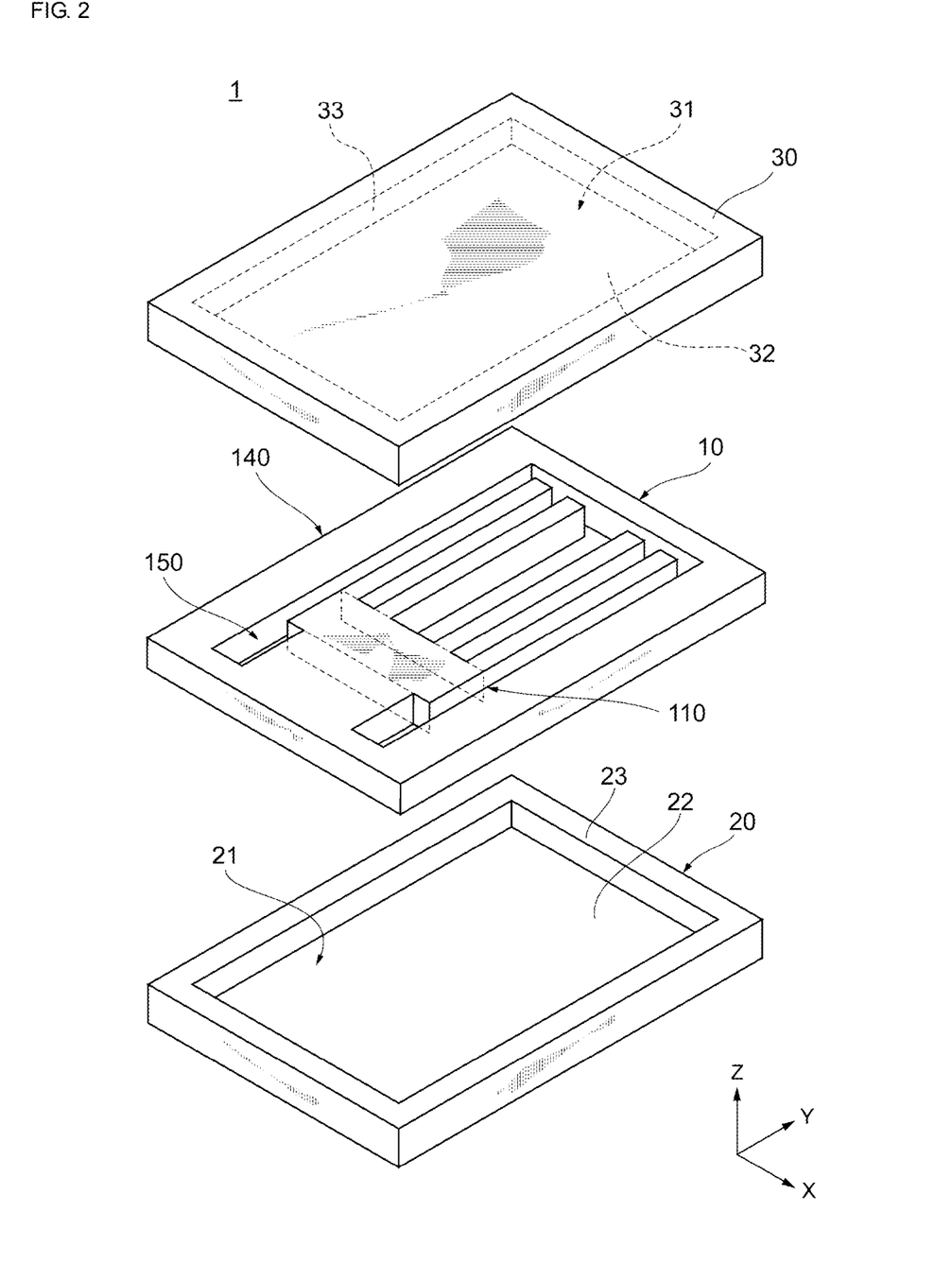
FIG. 2 is an exploded perspective view schematically illustrating a structure of the resonance device according to the embodiment of the present invention.

First, a configuration of a resonance device 1 according to the embodiment of the present invention will be described with reference to FIG. 1 and FIG. 2. FIG. 1 is a perspective view schematically illustrating an external appearance of the resonance device according to the embodiment of the present invention. FIG. 2 is an exploded perspective view schematically illustrating a structure of the resonance device according to the embodiment of the present invention.

(Resonance Device 1)

The resonance device 1 includes a resonator 10, and a lower cover 20 and an upper cover 30 that are provided so as to face each other with the resonator 10 interposed therebetween. The lower cover 20, the resonator 10, and the upper cover 30 are stacked in this order in a Z-axis direction. The resonator 10 and the lower cover 20 are joined, and the resonator 10 and the upper cover 30 are joined. A vibration space of the resonator 10 is formed between the lower cover 20 and the upper cover 30 joined to each other via the resonator 10. Each of the resonator 10, the lower cover 20, and the upper cover 30 is formed using a substrate capable of being processed by a microfabrication technique such as a semiconductor substrate, a glass substrate, an organic substrate, or the like.

Hereinafter, each configuration of the resonance device 1 will be described. Note that, in the following description to be given, a side on which the upper cover 30 is provided in the resonance device 1 will be referred to as an upper side (or a front side), and a side on which the lower cover 20 is provided will be referred to as a lower side (or a back side).

The resonator 10 is a MEMS oscillator manufactured using MEMS technology. The resonator 10 includes a vibrating portion 110, a holding portion 140, and a holding arm 150. The vibrating portion 110 is held in the vibration space, and vibrates in an out-of-plane bending vibration mode with respect to an XY plane. The holding portion 140 is provided in a rectangular frame shape so as to surround the vibrating portion 110. The holding arm 150 connects the vibrating portion 110 and the holding portion 140.

The lower cover 20 has a rectangular flat bottom plate 22 provided along an XY plane, and a side wall 23 extending in the Z-axis direction from a peripheral edge portion of the bottom plate 22. The side wall 23 is joined to the holding portion 140 of the resonator 10. In the lower cover 20, a recess 21 formed by a surface of the bottom plate 22 and an inner surface of the side wall 23 is formed on a surface facing the vibrating portion 110 of the resonator 10. The recess 21 is a rectangular parallelepiped cavity that opens upward, and forms a part of the vibration space of the resonator 10.

A structure of the upper cover 30 is symmetrical to a structure of the lower cover 20 with respect to the resonator 10. That is, the upper cover 30 has a rectangular flat bottom plate 32 provided along the XY plane and a side wall 33 extending in the Z-axis direction from a peripheral edge portion of the bottom plate 32, and the side wall 33 is joined to the holding portion 140 of the resonator 10. The upper cover 30 has a recess 31 formed on a surface facing the vibrating portion 110 of the resonator 10. The recess 31 is a rectangular parallelepiped cavity that opens downward, and forms a part of the vibration space of the resonator 10.

Note that the structure of the lower cover 20 and the structure of the upper cover 30 may be asymmetrical. For example, one of the lower cover 20 and the upper cover 30 may have a dome shape. The recess 21 of the lower cover 20 and the recess 31 of the upper cover 30 may differ in shape from each other, and for example, the recess 21 and the recess 31 may differ in depth from each other.

(Resonator 10)

Figure 3:
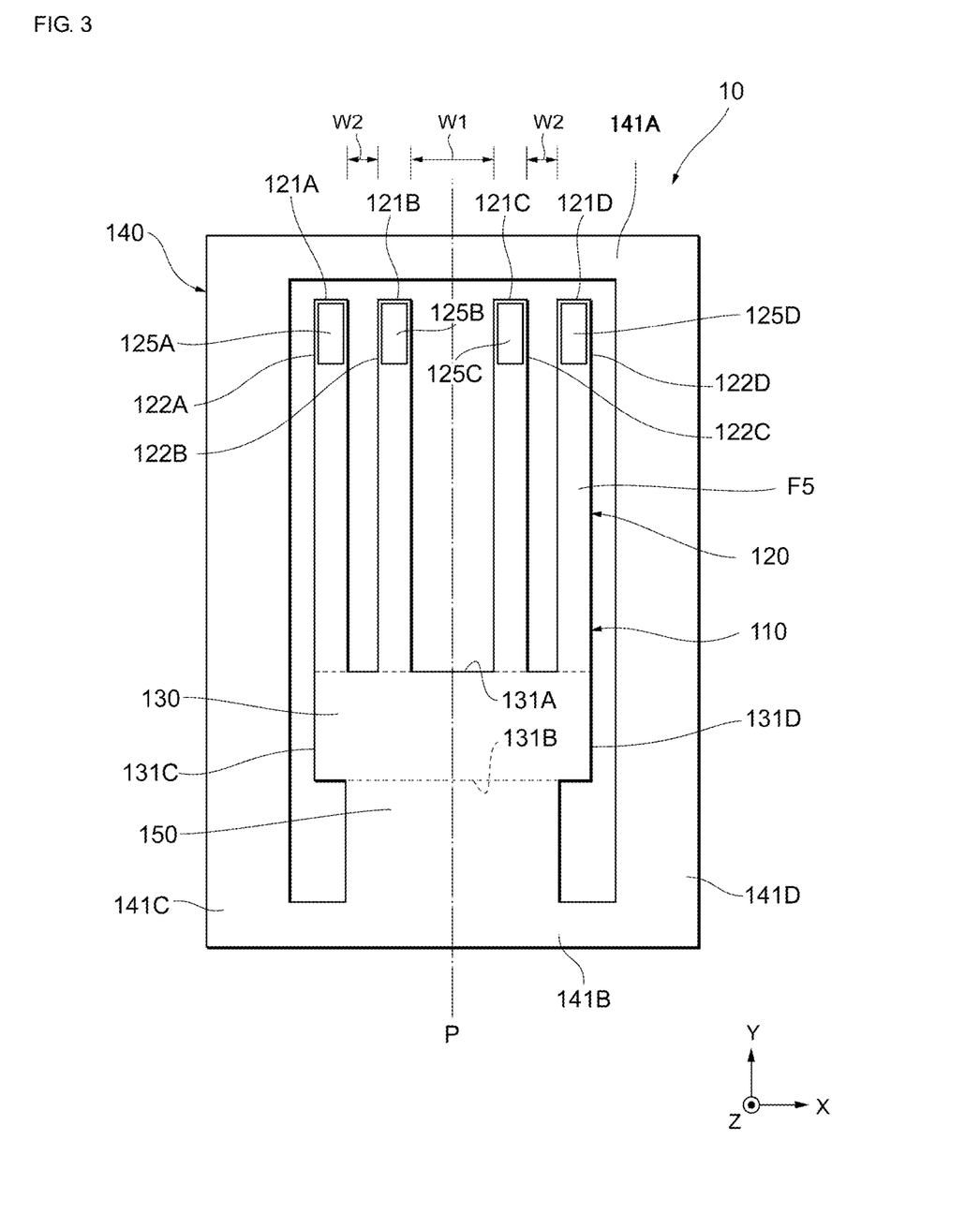
FIG. 3 is a plan view schematically illustrating a structure of a resonator according to the embodiment of the present invention.
Figure 4:
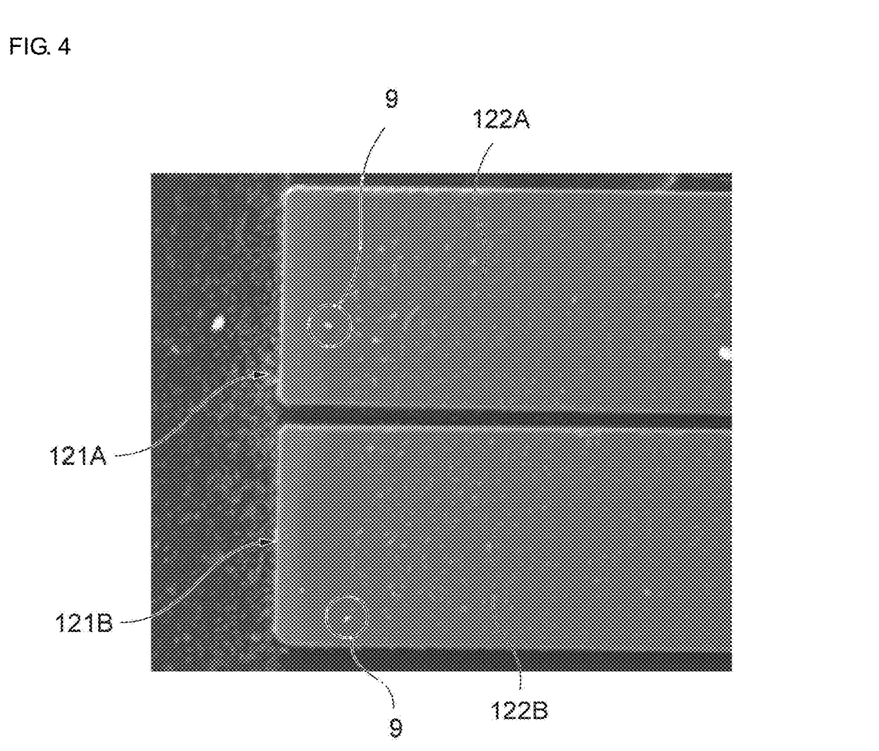
FIG. 4 is a photograph showing a state of a tip of a vibrating arm according to the embodiment of the present invention.

Next, configurations of the vibrating portion 110, the holding portion 140, and the holding arm 150 of the resonator 10 according to the embodiment of the present invention will be described in more detail with reference to FIG. 3 and FIG. 4. FIG. 3 is a plan view schematically illustrating a structure of the resonator according to the embodiment of the present invention. FIG. 4 is a photograph showing a state of a tip of the vibrating arm according to the embodiment of the present invention.

(Vibrating Portion 110)

As illustrated in FIG. 3, the vibrating portion 110 is provided inside the holding portion 140 in a plan view from the upper cover 30 side. A space is formed between the vibrating portion 110 and the holding portion 140 at a predetermined interval. The vibrating portion 110 has an excitation portion 120 formed of four vibrating arms 121A, 121B, 121C, and 121D, and a base portion 130 connected to the excitation portion 120. Note that, the number of vibrating arms is not limited to four, and may be set to, for example, an arbitrary number of equal to or more than one. In the present embodiment, the excitation portion 120 and the base portion 130 are integrally formed.

(Vibrating Arms 121A to 121D)

The vibrating arms 121A, 121B, 121C, and 121D each extend in the Y-axis direction, and are provided in this order in parallel at a predetermined interval in the X-axis direction. The vibrating arm 121A has a tip portion 122A serving as a release end, and a base end portion connected to the base portion 130 and serving as a fixed end. Similarly, the vibrating arms 121B, 121C, and 121D also have tip portions 122B, 122C, and 122D, respectively. Note that, the vibrating arms 121A to 121D have, for example, a width of about 50 μm in the X-axis direction and a length of about 450 μm in the Y-axis direction.

Of the four vibrating arms, the vibrating arms 121A and 121D are arranged on the outer side in the X-axis direction, while the vibrating arms 121B and 121C are arranged on the inner side in the X-axis direction. As an example, an interval W1 between the inner vibrating arm 121B in the X-axis direction and the inner vibrating arm 121C is set to be larger than an interval W2 between the outer vibrating arm 121A and the inner vibrating arm 121B, which are adjacent to each other, in the X-axis direction and the interval W2 between the outer vibrating arm 121D in the X-axis direction and the inner vibrating arm 121C, which are adjacent to each other, in the X-axis direction. As described above, by setting the interval W2 to be smaller than the interval W1, vibration characteristics are improved. The numerical values of the intervals are not limited, and for example, the interval W1 is about 25 μm, and the interval W2 is about 10 μm. Note that the interval W1 between the inner vibrating arms and the interval W2 between the inner vibrating arm and the outer vibrating arm are not limited to a mode illustrated in FIG. 3, and the interval W1 may be set to be smaller than the interval W2 or may be set to be equal to each other. This makes it possible to reduce the size of the resonance device, for example.

On the side of a surface of the vibrating portion 110 (a surface facing the upper cover 30), a protective film F5 is formed over the entire surface thereof. Further, mass addition films 125A, 125B, 125C and 125D are formed on surfaces of the protective film F5 at the tip portions 122A, 122B, 122C and 122D, respectively. With the formation of the mass addition films 125A to 125D in the vibrating arms 121A to 121D as described above, a weight per unit length of each of the tip portions 122A to 122D of the vibrating arms 121A to 121D (hereinafter, simply referred to as "weight") can be made larger than a weight of each of the base end portions of the vibrating arms 121A to 121D. That is, the tip portions 122A to 122D can function as weight portions of the vibrating arms 121A to 121D, respectively. This makes it possible to improve vibration characteristics of the vibrating arms 121A to 121D while maintaining a reduction in the size of the vibrating portion 110. Further, by appropriately setting the dimensions, the shapes, and the like of the protective film F5 and the mass addition films 125A to 125D, it is possible to change the mass and gravity of center of each of the vibrating arms 121A to 121D, and to set the resonant frequencies of the vibrating arms 121A to 121D to a predetermined value.

(Tip Portions 122A to 122D)

FIG. 4 is a photograph taken from a back surface (a surface facing the lower cover 20) of the vibrating portion according to the present embodiment, and specifically, shows, as an example, a back surface of the tip portion 122A of the vibrating arm 121A and a back surface of the tip portion 122B of the vibrating arm 121B. Note that a photograph showing back surfaces of the tip portions 122C and 122D are the same as those of the tip portions 122A and 122B, and therefore will not be described.

As illustrated in FIG. 4, particles 9 are attached to the back surfaces of the tip portions 122A and 122B. Further, corner portions of the tip portions 122A and 122B are scraped by a frequency adjustment process, and have a rounded shape. The particles 9 are obtained by scraping off a part of each of the tip portions 122A to 122D by the frequency adjustment process described later. The van der Waals force acts on the particles 9 attached to the vibrating arm 121A at all times with respect to the tip portion 122A. On the other hand, when the vibrating arm 121A vibrates, an inertial force proportional to the magnitude of an acceleration of the tip portion 122A acts on the particles 9. A direction of the inertial force acting on the particles 9 periodically changes in a direction approaching the tip portion 122A and a direction away from the tip portion 122A due to the vibration of the vibrating arm 121A. When the inertial force is greater than the van der Waals force, the weight of the tip portion 122A changes during the vibration of the vibrating arm 121A due to scattering of the particles 9 from the tip portion 122A or reattachment to the tip portion 122A. In other words, the resonant frequency of the vibrating arm 121A changes. The particles 9 also have the same influence on the vibrating arms 121B to 121D as in the case of the vibrating arm 121A.

In view of this, in the embodiment of the present invention, the resonance device 1 that can suppress scattering of the particles 9 and suppress the frequency fluctuation has been clarified. As will be described later in detail, when the resonant frequency of the resonator 10 is defined as X, a specific gravity of the particles 9 is defined as A, and a median size of the particles 9 (median value of the particle diameter) is defined as D50, the particles 9 attached to the tip portion satisfy D50≤189/(X×√A). Further, the particles 9 attached to the tip portion preferably satisfy D50≤60/(X×√A), and more preferably satisfy D50≤50/(X×√A). Note that in the present embodiment, not only the particles 9 attached to the tip portions 122A to 122D, but also all the particles in the vibration space of the resonance device 1 that have the same composition as that of the particles 9 and contain particles attached to any one of the resonator 10, the lower cover 20, and the upper cover 30, preferably satisfy D50≤189/(X×√A), more preferably satisfy D50≤60/(X×√A), and further preferably satisfy D50≤50/(X×√A).

(Base Portion 130)

As illustrated in FIG. 3, the base portion 130 has a front end portion 131A, a rear end portion 131B, a left end portion 131C, and a right end portion 131D in a plan view from the upper cover 30 side. The front end portion 131A, the rear end portion 131B, the left end portion 131C, and the right end portion 131D each are a part of an outer edge portion of the base portion 130. More specifically, the front end portion 131A is an end portion that extends in the X-axis direction on the excitation portion 120 side. The rear end portion 131B is an end portion that extends in the X-axis direction on the side opposite to the excitation portion 120. The left end portion 131C is an end portion that extends in the Y-axis direction on the side of the vibrating arm 121A when viewed from the vibrating arm 121D. The right end portion 131D is an end portion that extends in the Y-axis direction on the side of the vibrating arm 121D when viewed from the vibrating arm 121A.

Both ends of the left end portion 131C each connect one end of the front end portion 131A and one end of the rear end portion 131B. Both ends of the right end portion 131D each connect the other end of the front end portion 131A and the other end of the rear end portion 131B. The front end portion 131A and the rear end portion 131B face each other in the Y-axis direction. The left end portion 131C and the right end portion 131D face each other in the X-axis direction. The vibrating arms 121A to 121D are connected to the front end portion 131A.

When viewed from the upper cover 30 side, the base portion 130 has a substantially rectangular shape in which the front end portion 131A and the rear end portion 131B are long sides, and the left end portion 131C and the right end portion 131D are short sides. The base portion 130 is formed to be substantially plane-symmetric with respect to a virtual plane P defined along a perpendicular bisector of each of the front end portion 131A and the rear end portion 131B. Note that the base portion 130 is not limited to the rectangular shape illustrated in FIG. 3, and may have any other shape that is substantially plane-symmetric with respect to the virtual plane P. For example, the shape of the base portion 130 may be a trapezoidal shape in which one of the front end portion 131A and the rear end portion 131B is longer than the other. In addition, at least one of the front end portion 131A, the rear end portion 131B, the left end portion 131C, and the right end portion 131D may be bent or curved. Note that the virtual plane P is a plane passing through the center in a direction in which the vibrating arms 121A to 121D are aligned in the vibrating portion 110. In other words, the excitation portion 120 is formed to be plane-symmetric with respect to the virtual plane P. Specifically, the virtual plane P is a plane of symmetry between the vibrating arm 121A and the vibrating arm 121D, and is a plane of symmetry between the vibrating arm 121B and the vibrating arm 121C.

In the base portion 130, a base portion length, which is the longest distance in the Y-axis direction between the front end portion 131A and the rear end portion 131B, is about 40 μm as an example. Further, a base portion width, which is the longest distance in the X-axis direction between the left end portion 131C and the right end portion 131D, is about 300 μm as an example. Note that in the configuration example illustrated in FIG. 3, the base portion length corresponds to the length of the left end portion 131C or the right end portion 131D, and the base portion width corresponds to the length of the front end portion 131A or the rear end portion 131B.

(Holding Portion 140)

As illustrated in FIG. 3, the holding portion 140 has a frame body front portion 141A, a frame body rear portion 141B, a frame body left portion 141C, and a frame body right portion 141D in a plan view from the upper cover 30 side. The frame body front portion 141A, the frame body rear portion 141B, the frame body left portion 141C, and the frame body right portion 141D each is a part of a substantially rectangular frame body surrounding the vibrating portion 110. More specifically, the frame body front portion 141A is a portion extending in the X-axis direction on the excitation portion 120 side when viewed from the base portion 130. The frame body rear portion 141B is a portion extending in the X-axis direction on the base portion 130 side when viewed from the excitation portion 120. The frame body left portion 141C is a portion extending in the Y-axis direction on the side of the vibrating arm 121A when viewed from the vibrating arm 121D. The frame body right portion 141D is a portion extending in the Y-axis direction on the side of the vibrating arm 121D when viewed from the vibrating arm 121A.

Both ends of the frame body left portion 141C are connected to one end of the frame body front portion 141A and one end of the frame body rear portion 141B, respectively. Both ends of the frame body right portion 141D are connected to the other end of the frame body front portion 141A and the other end of the frame body rear portion 141B, respectively. The frame body front portion 141A and the frame body rear portion 141B face each other in the Y-axis direction with the vibrating portion 110 interposed therebetween. The frame body left portion 141C and the frame body right portion 141D face each other in the X-axis direction with the vibrating portion 110 interposed therebetween. Note that the holding portion 140 only needs to be provided in at least a part of a circumference of the vibrating portion 110, and the shape thereof is not limited to a frame-like shape that is continuous in the circumferential direction.

(Holding Arm 150)

The holding arm 150 is provided inside the holding portion 140, and connects the rear end portion 131B of the base portion 130 and the frame body rear portion 141B of the holding portion 140 to each other. The holding arm 150 is formed to be plane-symmetric with respect to the virtual plane P. Note that the holding arm 150 is not limited to the above-described configuration, and for example, may be configured by an arm connecting the rear end portion 131B of the base portion 130 and the frame body left portion 141C of the holding portion 140, and an arm connecting the rear end portion 131B of the base portion 130 and the frame body right portion 141D of the holding portion 140 to each other. Further, the holding arm 150 may be connected to the left end portion 131C or the right end portion 131D of the base portion 130, or may be connected to the frame body front portion 141A of the holding portion 140.

Figure 5:
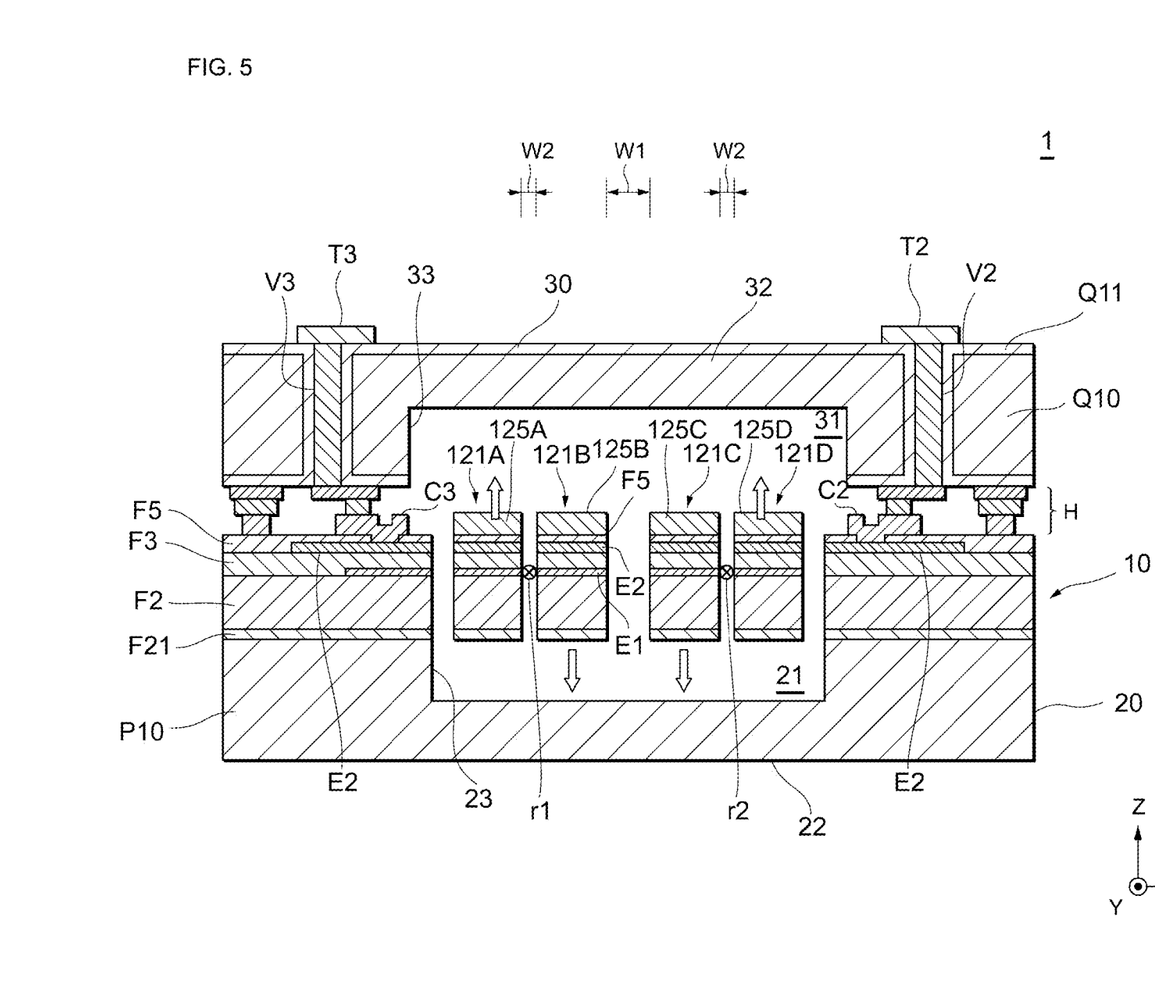
FIG. 5 is a diagram schematically illustrating a cross section along an X-axis of the resonance device illustrated in FIG. 1.
Figure 6:
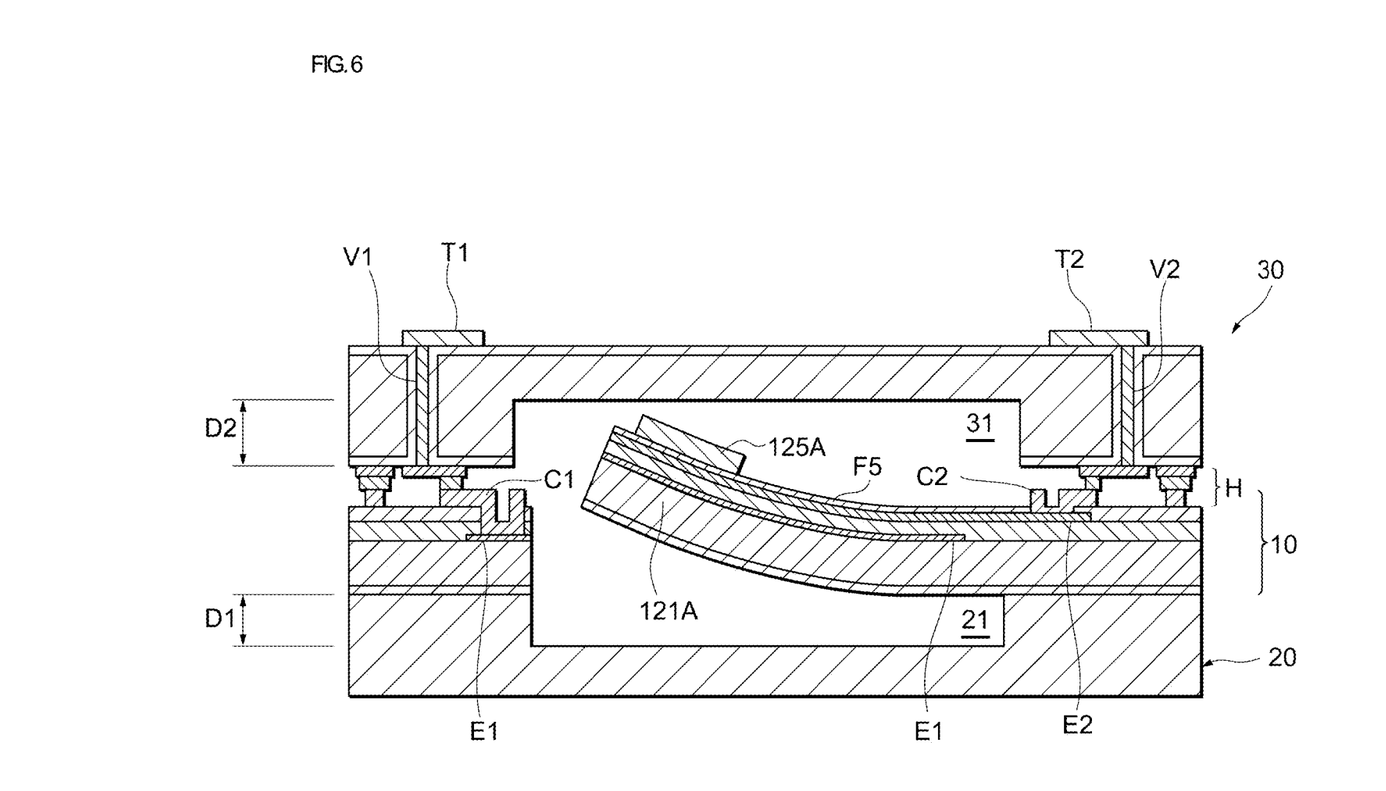
FIG. 6 is a diagram schematically illustrating a cross section along a Y axis of the resonance device during operation illustrated in FIG. 1.

Next, the stacked structure and operation of the resonance device 1 according to the embodiment of the present invention will be described with reference to FIG. 5 and FIG. 6. FIG. 5 is a diagram schematically illustrating a cross section along the X axis of the resonance device illustrated in FIG. 1. FIG. 6 is a diagram schematically illustrating a cross section along the Y axis during operation of the resonance device illustrated in FIG. 1. Note that, FIG. 5 only schematically illustrates a cross section of the tip portions 122A to 122D, extended lines C2 and C3, through electrodes V2 and V3, and the like in order to describe the stacked structure of the resonance device 1, and these are not necessarily located in the same planar cross-section. For example, the through electrodes V2 and V3 may be formed at positions away in the Y-axis direction from a cross section parallel to a ZX plane defined by the Z axis and the X axis by cutting the tip portions 122A to 122D. Similarly, FIG. 6 schematically illustrates a cross section of the vibrating arm 121A, the extended lines C1 and C2, the through electrodes V1 and V2, and the like in order to describe the stacked structure of the resonance device 1, and these are not necessarily located in the same planar cross-section.

(Stacked Structure)

In the resonance device 1, the holding portion 140 of the resonator 10 is joined on the side wall 23 of the lower cover 20, and the holding portion 140 of the resonator 10 and the side wall 33 of the upper cover 30 are joined to each other. Thus, the resonator 10 is held between the lower cover 20 and the upper cover 30, and a vibration space in which the vibrating portion 110 vibrates is formed by the lower cover 20, the upper cover 30, and the holding portion 140 of the resonator 10. The resonator 10, the lower cover 20, and the upper cover 30 are each formed by using a silicon (Si) substrate (hereinafter, referred to as an "Si substrate") as an example. Note that the resonator 10, the lower cover 20, and the upper cover 30 may be formed using a silicon on insulator (SOI) substrate in which a silicon layer and a silicon oxide film are laminated.

(Resonator 10)

The vibrating portion 110, the holding portion 140, and the holding arm 150 of the resonator 10 are integrally formed by the same process. In the resonator 10, a metal film E1 is laminated on an Si substrate F2 which is an example of a substrate. Then, a piezoelectric thin film F3 is laminated on the metal film E1 so as to cover the metal film E1, and a metal film E2 is further laminated on the piezoelectric thin film F3. On the metal film E2, the protective film F5 is laminated so as to cover the metal film E2. In the tip portions 122A to 122D, the mass addition films 125A to 125D each are further laminated on the protective film F5.

The Si substrate F2 is formed of, for example, a degenerated n-type silicon (Si) semiconductor having a thickness of about 6 μm, and may include phosphorus (P), arsenic (As), antimony (Sb), and the like as an n-type dopant. A resistance value of the degenerated silicon (Si) used for the Si substrate F2 is, for example, less than 16 mΩ·cm, and is more preferably equal to or less than 1.2 mΩ·cm. Further, a temperature characteristic correction layer F21 made of silicon oxide such as $SiO_2$, for example, is formed on a lower surface of the Si substrate F2. In other words, the temperature characteristic correction layer F21 corresponding to the silicon oxide film is exposed with respect to the bottom plate 22 of the lower cover 20. With the formation of the temperature characteristic correction layer F21, it is possible to improve the temperature characteristics of the resonant frequency.

The temperature characteristic correction layer F21 is formed of a material having a hardness lower than that of the bottom plate 22 of the lower cover 20. Note that the "hardness" in the present specification is defined by the Vickers hardness. The Vickers hardness of the temperature characteristic correction layer F21 is preferably equal to or less than 10 GPa, and the Vickers hardness of the bottom plate 22 of the lower cover 20 is preferably equal to or more than 10 GPa. This is in order to cause the temperature characteristic correction layer F21 of the tip portions 122A to 122D to collide with the bottom plate 22 of the lower cover 20 and to be easily scraped in the frequency adjustment process of the resonance device 1. That is, the temperature characteristic correction layer F21 can be referred to as a first frequency adjustment film. Since a part of the Si substrate F2 may be also scraped in the frequency adjustment process, the Vickers hardness of the Si substrate F2 is preferably equal to or less than 10 GPa, as in the case of the temperature characteristic correction layer F21.

It is desirable that the temperature characteristic correction layer F21 of the tip portions 122A to 122D be formed to have a uniform thickness. Note that, the uniform thickness means that variation in the thickness of the temperature characteristic correction layer F21 is within ±20% from an average value of the thickness. From the viewpoint of reducing the particle diameter of the particles 9, the average value of the thickness of the temperature characteristic correction layer F21 is preferably equal to or less than the median size D50 of the particles 9, and more preferably, the maximum value of the thickness of the temperature characteristic correction layer F21 is equal to or less than the median size D50 of the particles 9.

Note that the temperature characteristic correction layer F21 is also a temperature characteristic correction layer in addition to a function as the frequency adjustment film. The temperature characteristic correction layer is a layer having a function of at least reducing a temperature coefficient of the resonant frequency of the resonator 10, i.e., a change rate of the resonant frequency per unit temperature, in the vicinity of the room temperature. The vibrating portion 110 includes the temperature characteristic correction layer F21, and thus it is possible to reduce a change in the resonant frequency of the resonator 10 caused by the change in the ambient temperature. Note that the temperature characteristic correction layer may be formed on the upper surface of the Si substrate F2, or may be formed on both the upper surface and the lower surface of the Si substrate F2.

Each of the metal films E1 and E2 has an excitation electrode that excites the vibrating arms 121A to 121D, and an extended electrode that electrically connects the excitation electrode to an external power supply. Portions of the metal films E1 and E2 that function as excitation electrodes face each other with the piezoelectric thin film F3 interposed therebetween in the vibrating arms 121A to 121D. Portions of the metal films E1 and E2 that function as the extended electrodes are led out from the base portion 130 to the holding portion 140 via the holding arm 150, for example. The metal film E1 is electrically continuous across the entire resonator 10. The metal film E2 is electrically separated into portions formed in the outer vibrating arms 121A and 121D and portions formed in the inner vibrating arms 121B and 121C. A thickness of each of the metal films E1 and E2 is, for example, about equal to or more than 0.1 µm and equal to or less than 0.2 µm. For example, the metal films E1 and E2 are formed over substantially the entire surface of the resonator 10, and then patterned into the excitation electrode, the extended electrode, and the like by removal processing such as etching. In the metal films E1 and E2, metals having a crystal structure in a body-centered cubic structure are used. Specifically, the metal films E1 and E2 are formed by using Mo (molybdenum), tungsten (W), and the like.

The piezoelectric thin film F3 is a thin film formed by one type of piezoelectric body that converts electrical energy and mechanical energy from each other. The piezoelectric thin film F3 expands and contracts in the Y-axis direction in the in-plane direction of the XY plane in accordance with an electric field formed in the piezoelectric thin film F3 by the metal films E1 and E2. Due to the expansion and contraction of the piezoelectric thin film F3, the vibrating arms 121A to 121D each displace their free ends toward the inner surfaces of the lower cover 20 and the upper cover 30, and vibrate in the out-of-plane bending vibration mode.

The piezoelectric thin film F3 is formed of a material having a crystal structure of a wurtzite type hexagonal crystal structure, and for example, may have a nitride or an oxide such as aluminum nitride (AlN), scandium nitride aluminum (ScAlN), zinc oxide (ZnO), gallium nitride (GaN), indium nitride (InN), or the like as a main component. Note that, in the scandium aluminum nitride, a part of aluminum in aluminum nitride is substituted with scandium, and may be substituted with two elements such as magnesium (Mg) and niobium (Nb) or magnesium (Mg) and zirconium (Zr), instead of scandium. The piezoelectric thin film F3 has a thickness of, for example, about 1 µm, but may have a thickness of about 0.2 µm to 2 µm.

The protective film F5 protects the metal film E2, which is the upper electrode for piezoelectric vibration, from oxidation. Further, the protective film F5 is formed of a material having a hardness lower than that of the bottom plate 32 of the upper cover 30. The Vickers hardness of the protective film F5 is preferably equal to or less than 10 GPa, and the Vickers hardness of the bottom plate 32 of the upper cover 30 is preferably equal to or more than 10 GPa. This is in order to cause the protective film F5 of the tip portions 122A to 122D to collide with the bottom plate 32 of the upper cover 30 and to be easily scraped in the frequency adjustment process of the resonance device 1. That is, the protective film F5 corresponds to a second frequency adjustment film. The protective film F5 is, for example, a silicon oxide film, and is exposed with respect to the bottom plate 32 of the upper cover 30. Note that, as long as being provided on the upper cover 30 side, the protective film F5 may not be exposed with respect to the bottom plate 32 of the upper cover 30. For example, a film that covers the protective film F5, such as a parasitic capacitance reduction film that reduces capacitance of a wiring formed in the resonator 10, may be formed.

It is desirable that the protective film F5 of the tip portions 122A to 122D be formed to have a uniform thickness. Note that, the uniform thickness means that variation in the thickness of the protective film F5 is within ±20% from the average value of the thickness. From the viewpoint of reducing the particle diameter of the particles 9, the average value of the thickness of the protective film F5 is preferably equal to or less than the median size D50 of the particles 9, and more preferably, the maximum value of the thickness of the protective film F5 is equal to or less than the median size D50 of the particles 9.

Note that, the protective film F5 is not limited to a silicon oxide film, and may be formed of, for example, a nitride film such as aluminum nitride (AlN), silicon nitride (SiN), and the like or an oxide film such as alumina oxide ($Al_2O_3$), tantalum pentoxide ($Ta_2O_5$), and the like.

The mass addition films 125A to 125D are formed by the removal process such as etching. Specifically, mass addition films are formed on substantially the entire surface of the vibrating portion 110, and the mass addition films of portions other than the tip portions 122A to 122D by etching are removed, thereby forming the mass addition films 125A to 125D. In terms of the efficiency of the frequency adjustment, the mass addition films 125A to 125D are preferably formed of a material that has a rate of mass reduction higher than that of the protective film F5. The rate of mass reduction is represented by the product of the etching rate and the density. The etching rate is a thickness to be removed per unit time. In addition, from the viewpoint of efficiently increasing the weight of the tip portions 122A to 122D, it is preferable that the mass addition films 125A to 125D be formed of a material having a large specific gravity. Specifically, the mass addition films 125A to 125D are formed of, for example, a metallic material such as molybdenum (Mo), tungsten (W), gold (Au), platinum (Pt), nickel (Ni), and titanium (Ti).

In a case the mass addition films 125A to 125D are allowed to function as a third frequency adjustment film, the mass addition films 125A to 125D are formed of a material having a lower hardness than the bottom plate 32 of the upper cover 30. The Vickers hardness of the mass addition films 125A to 125D is preferably equal to or less than 10 GPa, and more preferably equal to or less than 2 GPa. Note that the upper cover 30 may be provided with a getter layer, which will be described later, in a portion with which the frequency adjustment film comes into contact. In this case, it is preferable that the Vickers hardness of the frequency adjustment film on the upper cover 30 side, such as the protective film F5, the mass addition films 125A to 125D, and the like be lower than the Vickers hardness of the getter layer. For example, the Vickers hardness of the frequency adjustment film on the upper cover 30 side is preferably equal to or less than 0.9 GPa.

Note that, in the protective film F5 and the mass addition films 125A to 125D, when the relationship in the rate of mass reduction is as described above, the magnitude relationship between the etching rates is arbitrary. The etching method for the protective film F5 and the mass addition films 125A to 125D is, for example, dry etching for radiating an argon (Ar) ion beam. Although it is possible to irradiate a wide range of the resonator 10 with the ion beam, since the ion beam has a charge, there is concern that the mass addition films 125A to 125D may be charged. From the viewpoint of suppressing degradation of vibration characteristics due to charging, the mass addition films 125A to 125D may be electrically connected to the metal film E1 or E2, respectively.

On the protective film F5 of the holding portion 140, the extended lines C1, C2, and C3 are formed. The extended line C1 is electrically connected to the metal film E1 through a through-hole formed in the piezoelectric thin film F3 and the protective film F5. The extended line C2 is electrically connected to portions formed on the outer vibrating arms 121A and 121D of the metal film E2 through the through-holes formed in the protective film F5. The extended line C3 is electrically connected to portions formed on the inner vibrating arms 121B and 121C of the metal film E2 through the through-holes formed in the protective film F5. The extended lines C1 to C3 are formed of a metallic material such as aluminum (Al), germanium (Ge), gold (Au), tin (Sn), or the like.

(Lower Cover 20)

The bottom plate 22 and the side wall 23 of the lower cover 20 are integrally formed by the Si substrate P10. The Si substrate P10 is formed of silicon that is not degenerated, and the resistivity thereof is, for example, equal to or more than 10 Ω·cm. The Si substrate P10 is exposed inside the recess 21 of the lower cover 20. However, a getter layer may be formed on a surface of the recess 21 of the lower cover 20, the surface facing the resonator 10.

A thickness of the lower cover 20 defined in the Z-axis direction is about 150 μm, and a depth D1 of the recess 21 defined in the same manner is about 100 μm. Since the amplitudes of the vibrating arms 121A to 121D are limited to the depth D1, the maximum amplitudes on the lower cover 20 side are about 100 μm.

Note that the lower cover 20 can also be regarded as a part of the SOI substrate. When assuming that the resonator 10 and the lower cover 20 are MEMS substrates formed by an integrated SOI substrate, the Si substrate P10 of the lower cover 20 corresponds to the support substrate of the SOI substrate, the temperature characteristic correction layer F21 of the resonator 10 corresponds to the BOX layer of the SOI substrate, and the Si substrate F2 of the resonator 10 corresponds to the active layer of the SOI substrate. At this time, various semiconductor elements, circuits, and the like may be formed on an outer side portion of the resonance device 1 by using a part of a continuous MEMS substrate.

(Upper Cover 30)

The bottom plate 32 and the side wall 33 of the upper cover 30 are integrally formed by the Si substrate Q10. It is preferable that a front surface and a back surface of the upper cover 30, and an internal surface of the through-hole be covered with a silicon oxide film Q11. The silicon oxide film Q11 is formed on a front surface of the Si substrate Q10 by, for example, oxidation of the Si substrate Q10 or chemical vapor deposition (CVD). The Si substrate Q10 is exposed inside the recess 31 of the upper cover 30. However, a getter layer may be formed on a surface of the recess 31 of the upper cover 30, the surface facing the resonator 10. The getter layer is formed of, for example, titanium (Ti), suctions an outgas emitted from a joint portion H, and suppresses a decrease in the degree of vacuum in the vibration space.

A thickness of the upper cover 30 defined in the Z-axis direction is about 150 μm, and a depth D2 of the recess 31 defined in the same manner is about 100 μm. Since the amplitudes of the vibrating arms 121A to 121D are limited to the depth D2, the maximum amplitude on the upper cover 30 side is about 100 μm.

Terminals T1, T2, and T3 are formed on an upper surface of the upper cover 30 (a surface opposite to a surface facing the resonator 10). The terminal T1 is a mounting terminal for grounding the metal film E1. The terminal T2 is a mounting terminal for electrically connecting the metal film E2 of the outer vibrating arms 121A and 121D to the external power supply. The terminal T3 is a mounting terminal for electrically connecting the metal film E2 of the inner vibrating arms 121B and 121C to the external power supply. The terminals T1 to T3 are formed by plating a metallization layer (underlying layer) such as chromium (Cr), tungsten (W), nickel (Ni) with nickel (Ni), gold (Au), silver (Ag), copper (Cu), or the like, for example. Note that a dummy terminal electrically insulated from the resonator 10 may be formed on the upper surface of the upper cover 30 for the purpose of adjusting the parasitic capacitance and a mechanical strength balance.

Through electrodes V1, V2 and V3 are formed inside the side wall 33 of the upper cover 30. The through electrode V1 electrically connects the terminal T1 and the extended line C1, the through electrode V2 electrically connects the terminal T2 and the extended line C2, and the through electrode V3 electrically connects the terminal T3 and the extended line C3 to each other. The through electrodes V1 to V3 are formed by filling through-holes penetrating through the side wall 33 of the upper cover 30 in the Z-axis direction with a conductive material. The electrically conductive material to be filled is, for example, polycrystalline silicon (Poly-Si), copper (Cu), gold (Au), or the like.

The joint portion H is formed between the side wall 33 of the upper cover 30 and the holding portion 140 in order to join the side wall 33 of the upper cover 30 and the holding portion 140 of the resonator 10 to each other. The joint portion H is formed in a closed annular shape surrounding the vibrating portion 110 in the XY plane so as to airtightly seal the vibration space of the resonator 10 in a vacuum state. The joint portion H is formed of, for example, a metal film in which an aluminum (Al) film, a germanium (Ge) film, and an aluminum (Al) film are stacked in this order and are eutectic bonded. Note that the joint portion H may be formed by a combination of films appropriately selected from gold (Au), tin (Sn), copper (Cu), titanium (Ti), silicon (Si), and the like. In addition, in order to improve close contact property, the joint portion H may interpose a metal compound such as titanium nitride (TiN), tantalum nitride (TaN), or the like.

(Operation)

In the present embodiment, the terminal T1 is grounded, and alternating voltages having phases opposite to each other are applied to the terminal T2 and the terminal T3. Therefore, the phase of the electric field formed in the piezoelectric thin film F3 of the outer vibrating arms 121A and 121D, and the phase of the electric field formed in the piezoelectric thin film F3 of the inner vibrating arms 121B and 121C are opposite to each other. Accordingly, the outer vibrating arms 121A and 121D and the inner vibrating arms 121B and 121C vibrate in opposite directions to each other. For example, when the tip portions 122A and 122D of the outer vibrating arms 121A and 121D are displaced toward the inner surface of the upper cover 30, the tip portions 122B and 122C of the inner vibrating arms 121B and 121C are displaced toward the inner surface of the lower cover 20. As described above, the vibrating arm 121A and the vibrating arm 121B vibrate in vertically opposite directions about a central axis r1 extending in the Y-axis direction between the vibrating arm 121A and the vibrating arm 121B adjacent to each other. Further, the vibrating arm 121C and the vibrating arm 121D vibrate in vertically opposite directions about a central axis r2 extending in the Y-axis direction between the vibrating arm 121C and the vibrating arm 121D adjacent to each other. As a result, torsional moments in opposite directions are generated at the central axes r1 and r2, and bending vibration in the base portion 130 is generated.

The resonance device 1 performs a frequency adjustment process of adjusting the resonant frequency of the resonator 10 after the vibrating portion 110 of the resonator 10 is sealed. In the frequency adjustment process, a voltage higher than the drive voltage of a normal driving is applied to the resonator 10 to be over-excited, and the tip portions 122A to 122D are caused to collide with at least one of the bottom plate 22 of the lower cover 20 and the bottom plate 32 of the upper cover 30, and a part of the tip portions 122A to 122D is scraped off. At this time, when the impact applied to the tip portions 122A to 122D is too large, a failure in adjustment of the resonant frequency due to excessive scraping of the tip portions 122A to 122D, a deterioration in vibration characteristics due to damage to the vibrating arms, and the like may be generated. Therefore, the amplitudes of the tip portions 122A to 122D in the frequency adjustment process are set to be substantially equal to the smaller one of the depth D1 of the recess 21 of the lower cover 20 and the depth D2 of the recess 31 of the upper cover 30. In the present embodiment, since the depth D1 and the depth D2 are about 100 μm, the amplitude of the tip portion in the frequency adjustment process is about 100 μm. When the maximum amplitude of the vibrating arms 121A to 121D in the frequency adjusting process is equal to or less than 100 μm, curvatures of the vibrating arms 121A to 121D when coming into contact with the vibrating arms and the lower cover 20 and the upper cover 30 in the frequency adjustment process can be reduced. By reducing the curvatures of the vibrating arms 121A to 121D that may cause damage to the metal films E1 and E2 and the piezoelectric thin film F3, it is possible to suppress the malfunction of the vibrating arms 121A to 121D, and improve a yield of the resonance device 1. Further, an impact force when the tip portions 122A to 122D collide with the lower cover 20 and the upper cover 30 and a part of each of the tip portions 122A to 122D is scraped off concentrates on the corner portions of the vibrating arms 121A to 121D. Since a range where the impact force is applied is small, the particle diameter of the generated particles 9 can be reduced. Note that the amplitude of the tip portion in the normal driving is set to about 10 μm.

(Particles 9)

Figure 7:
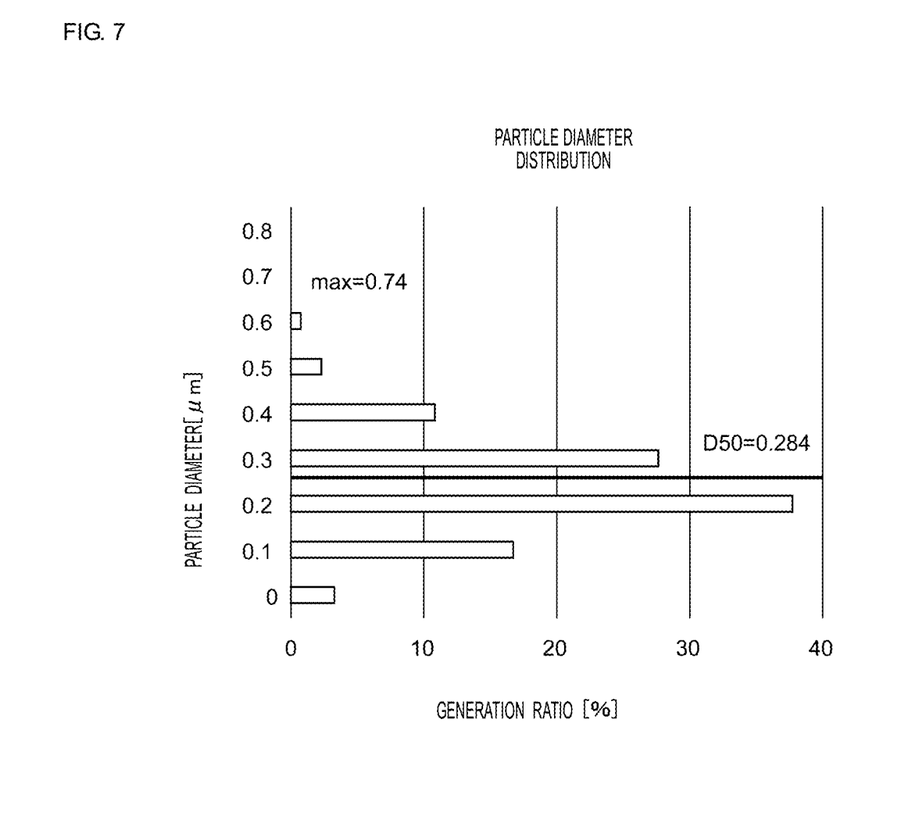
FIG. 7 is a graph showing a particle diameter distribution of particles attached to a tip of the vibrating arm.
Figure 8:
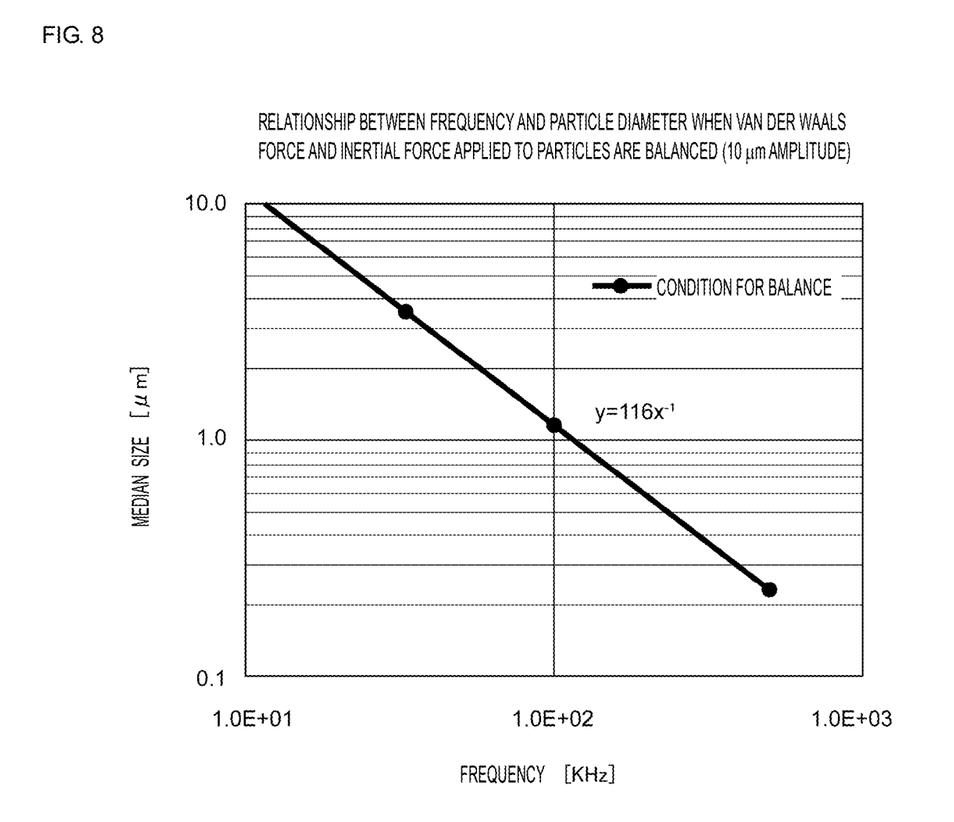
FIG. 8 is a graph showing a condition in which the van der Waals force and the inertial force applied to particles are balanced during excitation at an amplitude of 10 μm.
Figure 9:
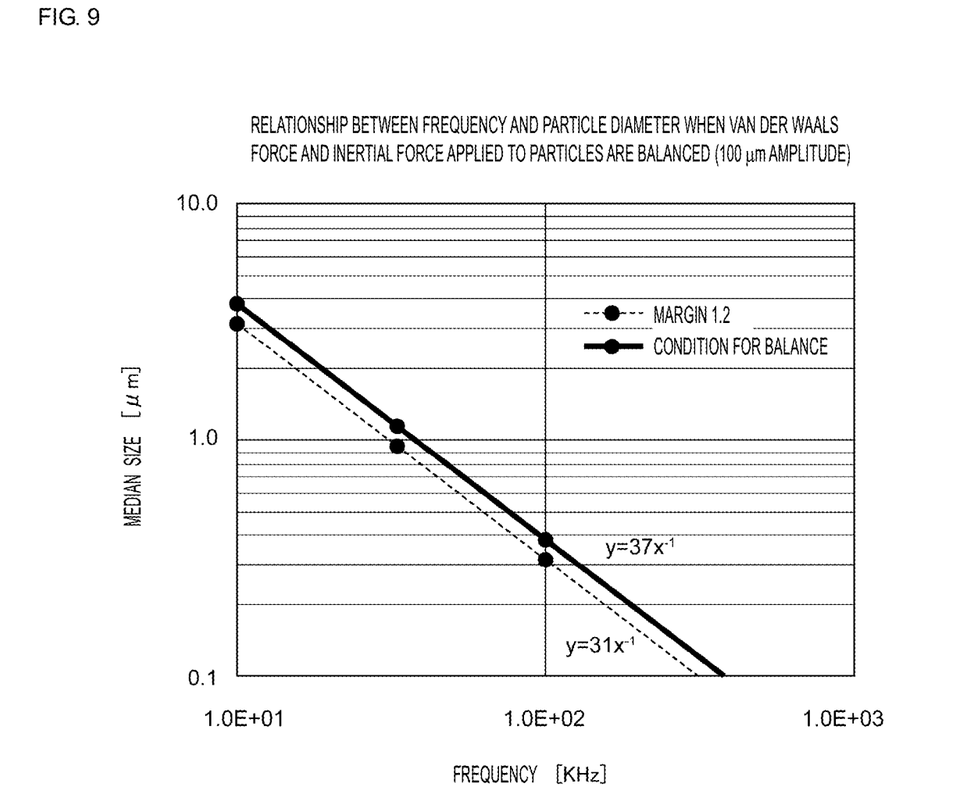
FIG. 9 is a graph showing a condition in which the van der Waals force and the inertial force applied to particles are balanced during excitation at an amplitude of 100 μm.

Next, with reference to FIG. 7 to FIG. 9, a description will be given of particles 9 that are generated by scraping off portions of a part of each of the tip portions 122A to 122D. FIG. 7 is a graph showing a particle diameter distribution of particles attached to the tip of the vibrating arm. FIG. 8 is a graph showing conditions in which the van der Waals force and the inertial force applied to the particles are balanced during excitation at an amplitude of 10 μm. FIG. 9 is a graph showing conditions in which the van der Waals forces and inertial forces applied to the particles are balanced during excitation at an amplitude of 100 μm.

Note that most of the particles 9 attached to the tip portions 122A to 122D are particles made of silicon oxide. That is, the vibrating arms 121A to 121D have the silicon oxide film on at least one of the lower cover 20 side and the upper cover 30 side, and the particles 9 are mainly generated from the silicon oxide film. The temperature characteristic correction layer F21 corresponds to the silicon oxide film on the lower cover 20 side serving as a generation source of the particles 9, and the protective film F5 corresponds to the silicon oxide film on the upper cover 30 side serving as the generation source of the particles 9. Hereinafter, the silicon oxide particles 9 will be described.

FIG. 7 illustrates the particle diameter distribution derived from the measurement results of the particle diameters of the particles 9 attached to the tip portions 122A to 122D, by opening the resonance device 1 in which the resonant frequency is adjusted to 32.768 KHz. The vertical axis represents the particle diameter [μm], and the horizontal axis represents a generation ratio [%]. In the measurement of the particle diameter of the particles 9, the back surface of any one of the tip portions was photographed by a scanning electron microscope having a magnification set to 5000 times, and the individual particle diameters and the particle diameter distribution were calculated by image analysis. For the image analysis, an image processing software HALCON (registered trademark) manufactured by MVTec Software Inc., which is a product of LINX Corporation, was used. From the captured image of the particles 9, a radius of a circle corresponding to an area subjected to the image processing was taken as the particle diameter of the particles 9.

A maximum particle diameter max of the particles 9 attached to the tip portions 122A to 122D was 0.74 μm, the median size D50 was 0.284 μm, and a particle diameter ratio (median size D50/maximum particle diameter max) of the median size D50 with respect to the maximum particle diameter max was approximately 0.38. The particle diameter ratio was the same even when the driving voltage was changed. From this, it was found that an estimate of the maximum particle diameter max can be made by calculating the median size D50 without examining the particle diameter of all the particles 9.

The van der Waals force is proportional to the particle diameter of the particles 9, and the inertial force is proportional to the mass of the particles 9, i. e., the cube of the particle diameter of the particles 9. The inertial force is also proportional to the acceleration of the particles 9 determined by the frequencies and amplitudes of the vibrating arms 121A to 121D. Therefore, when the vibrating arms 121A to 121D vibrate with constant amplitudes, the conditions for balance between the van der Waals force acting on the particles 9 and the inertial force can be expressed by the frequency and the particle diameter. When the maximum particle diameter max is equal to or smaller than the particle diameter at which the van der Waals force and the inertial force are balanced, the van der Waals force the inertial force is established in all the particles 9. Therefore, the change in the weight of the vibrating arms 121A to 121D due to scattering or attaching of the particles 9 is reduced. This reduces the change in the resonant frequency of the resonance device 1.

FIG. 8 is a graph showing conditions for the balance between, when the amplitude is set to 10 μm which is the amplitude of the normal driving, the van der Waals force acting on the particles 9 having the maximum particle diameter max balances the inertial force, the conditions being calculated by using the above-described particle diameter ratio. In FIG. 8, the horizontal axis represents the frequency X [kHz], the vertical axis represents the median size D50 [μm], and a conditional expression for the balance represents $D50=116/X$. Therefore, when $D50 \leq 116/X$ is satisfied, the van der Waals force the inertial force is established in all the particles 9 during the normal driving.

FIG. 9 is a graph showing conditions for the balance between, when the amplitude is set to the depth of the recess 21, i. e., 100 μm which is the amplitude in the frequency adjustment process, the van der Waals force acting on the particles 9 having the maximum particle diameter max balances the inertial force, the conditions being calculated by using the above-described particle diameter ratio. In FIG. 9, the horizontal axis represents the frequency X [kHz], the vertical axis represents the median size D50 [μm], and the conditional expression for the balance is D50=37/X, and the conditional expression in which a margin of 1.2 times is taken into consideration is D50=31/X. Therefore, when D50≤37/X is satisfied, the van der Waals force the inertial force is established in all the particles 9 during the frequency adjustment process. Further, when D50≤31/X is satisfied, the van der Waals force the inertial force is established in all the particles 9 even when the inertial force acting on the particles 9 is 20% larger than the calculated value.

Note that, in order to satisfy D50≤116/X, when the thickness of the silicon oxide film which is a generation source of the particles 9 is defined as T, it is preferable to satisfy T≤116/X. That is, it is preferable that the thickness of at least one of the temperature characteristic correction layer F21 and the protective film F5 be equal to or less than 116/X or less. In order to satisfy D50≤37/X, it is preferable to satisfy T≤37/X, and in order to satisfy D50≤31/X, it is preferable to satisfy T≤31/X.

Note that, as for the particles 9 made of a material other than silicon oxide, the median size D50 satisfying the van der Waals force the inertial force can be calculated by setting the specific gravity of the material of the particles 9 to be A. More specifically, in the normal driving in which the amplitude is equal to or less than 10 μm, the van der Waals force the inertial force is satisfied in all the particles 9 when the D50≤189/(X×√A) is satisfied. Similarly, in the frequency adjustment process in which the amplitude is 100 μm, when D50≤60/(X×√A) is satisfied, the van der Waals force the inertial force is established in all the particles 9. Further, when the D50≤50/(X×√A) is satisfied, the van der Waals force the inertia force is established in all the particles 9 even when the inertial force acting on the particles 9 is 20% larger than the calculated value.

<Supplementary Notes>

Hereinafter, some or all of the embodiment of the present invention will be described as supplementary notes. Note that the present invention is not limited to the following supplementary notes.

According to an aspect of the present invention, there is provided the resonance device 1 including the lower cover 20, the upper cover 30 joined to the lower cover 20, and the resonator 10 having vibrating arms 121A to 121D that bend and vibrate in a vibration space formed between the lower cover 20 and the upper cover 30, in which particles 9 are attached to the tip portions 122A to 122D of the vibrating arms 121A to 121D, and when the median size of the particles 9 is defined as D50, and the specific gravity of the particles 9 is defined as A, and the resonant frequency of the resonator 10 is defined as X, D50≤189/(X×√A).

According to this, the van der Waals force the inertial force is established in all the particles 9 during the normal driving. Therefore, the change in the weight of the vibrating arms 121A to 121D due to scattering or attaching of the particles 9 is reduced. This reduces the change in the resonant frequency during the normal driving of the resonance device 1.

As a preferred aspect, the lower cover 20 and the upper cover 30 are respectively provided with recesses 21 and 31 forming a vibration space, and the depths of the respective recesses 21 and 31 of the lower cover 20 and the upper cover 30 are equal to or less than 100 μm.

According to this, it is possible to reduce the curvatures of the vibrating arms 121A to 121D when coming into contact with the lower cover 20 and the upper cover 30 in the frequency adjusting process. By reducing the curvatures of the vibrating arms 121A to 121D that may cause damage to the metal films E1 and E2 and the piezoelectric thin film F3, it is possible to suppress the malfunction of the vibrating arms 121A to 121D, and improve the yield of the resonance device 1. Further, the impact force when the tip portions 122A to 122D collide with the lower cover 20 and the upper cover 30 and a part of each of the tip portions 122A to 122D is scraped off, concentrates on the corner portions of the vibrating arms 121A to 121D. Since a range where the impact force is applied is small, the particle diameter of the generated particles 9 can be reduced.

As a preferred aspect, the resonance device 1 satisfies D50≤60/(X×√A).

According to this, the van der Waals force the inertial force is established in all the particles 9 during the frequency adjustment process. That is, the change in the resonant frequency during the frequency adjustment process of the resonance device 1 is reduced.

As a preferred aspect, the resonance device 1 satisfies D50≤50/(X×√A).

According to this, the van der Waals force the inertial force is established in all the particles 9 even when the inertial force acting on the particles 9 during the frequency adjustment process is 20% larger than the calculated value. That is, the change in the resonant frequency during the frequency adjustment process of the resonance device 1 is further reliably reduced.

As a preferable aspect, the vibrating arms 121A to 121D have a silicon oxide film on at least one of the lower cover 20 side and the upper cover 30 side thereof.

According to this, since the silicon oxide film is easily scraped due to the collision with at least one of the lower cover 20 and the upper cover 30, it is possible to shorten the time required for adjusting the resonant frequency.

As a preferred aspect, the particles 9 are made of silicon oxide.

According to this, since the particles 9 are generated from the silicon oxide film that is easily scraped, the particle diameter of the particles 9 is small, and scattering of the particles 9 from the vibrating arms 121A to 121D when vibrated can be reduced. In addition, when the particle diameter of the particles 9 scraped off by one collision from the tip portions 122A to 122D is small, the rate of decrease of the weight per unit time of the tip portions 122A to 122D in the frequency adjustment process decreases, and an amount of change in the resonant frequency per unit time can be reduced. Therefore, it is possible to improve the accuracy of the adjustment of the resonant frequency.

As a preferable aspect, when the thickness of the silicon oxide film is defined as T, T≤116/X is satisfied.

According to this, the particle diameter of the particles 9 can be reduced. More specifically, the median size D50 of the particles 9 can be smaller than 116/X.

As a preferred aspect, the corners of the tip portions 122A to 122D of the vibrating arms 121A to 121D have a rounded shape.

As described above, according to an aspect of the present invention, it is possible to provide the resonance device capable of suppressing the fluctuation of the resonant frequency.

Note that, although the example of the out-of-plane bending vibration as a preferred aspect has been described, the same effect can be obtained even in the in-plane bending vibration. Specifically, in a case where the vibrating arm vibrates in the lateral direction (X direction), and the normal amplitude is equal to or less than 10 μm, it is preferable to satisfy $D50 \leq 189/(X \times \sqrt{A})$. In addition, in a case where the interval between the vibrating arm and the holding portion side surface is equal to or less than 100 μm, it is preferable to satisfy $D50 \leq 60/(X \times \sqrt{A})$, and in consideration of the margin, it is preferable to satisfy $D50 \leq 50/(X \times \sqrt{A})$.

The embodiment described above is intended to facilitate understanding of the present invention, and is not intended to construe the present invention in a limiting sense. The present invention can be modified/improved without departing from the gist thereof, and the present invention also includes equivalents thereof. In other words, those skilled in the art will appreciate that modifications may be made by those skilled in the art without departing from the spirit and scope of the present invention as long as they have the features of the present invention. For example, the elements, the arrangement, the material, the condition, the shape, the size, and the like included in each embodiment are not limited to the examples described above, and may be appropriately changed. Furthermore, the elements included in each embodiment may be combined as technically possible, and the combinations thereof are also included in the scope of the present invention as long as they include the features of the present invention.

REFERENCE SIGNS LIST

1 RESONANCE DEVICE
9 PARTICLE
10 RESONATOR
20 LOWER COVER
30 UPPER COVER
21, 31 RECESS
22, 32 BOTTOM PLATE
23, 33 SIDE WALL
110 VIBRATING PORTION
121A to 121D VIBRATING ARM
122A to 122D TIP PORTION
130 BASE PORTION
140 HOLDING PORTION
150 HOLDING ARM
F2 Si SUBSTRATE
F21 TEMPERATURE CHARACTERISTIC CORRECTION LAYER
F3 PIEZOELECTRIC THIN FILM
F5 PROTECTIVE FILM
E1, E2 METAL FILM
125A, 125B, 125C, 125D MASS ADDITION FILM

The invention claimed is:

1. A resonance device comprising:
a lower cover;
an upper cover joined to the lower cover;
a resonator having a vibrating arm that bends and vibrates in a vibration space between the lower cover and the upper cover; and
a particle attached to a tip portion of the vibrating arm, wherein
when a median size of the particle is defined as D50, a specific gravity of the particle is defined as A, and a resonant frequency of the resonator is defined as X, $D50 \leq 189/(X \times \sqrt{A})$.

2. The resonance device according to claim 1, wherein $D50 \leq 60/(X \times \sqrt{A})$.

3. The resonance device according to claim 1, wherein $D50 \leq 50/(X \times \sqrt{A})$.

4. The resonance device according to claim 1,
wherein the lower cover and the upper cover respectively include recesses that together form the vibration space, and
depths of the respective recesses of the lower cover and the upper cover are equal to or less than 100 μm.

5. The resonance device according to claim 4, wherein $D50 \leq 60/(X \times \sqrt{A})$.

6. The resonance device according to claim 4, wherein $D50 \leq 50/(X \times \sqrt{A})$.

7. The resonance device according to claim 1, wherein the vibrating arm has a silicon oxide film on at least one of a lower cover side and a upper cover side thereof.

8. The resonance device according to claim 7, wherein the particle is made of silicon oxide.

9. The resonance device according to claim 7, wherein, when a thickness of the silicon oxide film is defined as T, $T \leq 116/X$.

10. The resonance device according to claim 7, further comprising a mass addition film on the silicon oxide film at the tip portion of the vibrating arm.

11. The resonance device according to claim 1, wherein a corner of the tip portion of the vibrating arm has a rounded shape.

12. The resonance device according to claim 1, further comprising a mass addition film on the tip portion of the vibrating arm.

13. The resonance device according to claim 1, further comprising a protective film on at least one of a lower cover side and a upper cover side the vibrating arm.

14. The resonance device according to claim 13, further comprising a mass addition film on the tip portion of the vibrating arm.

15. The resonance device according to claim 1, wherein a material of the protective film is selected from silicon oxide, aluminum nitride, silicon nitride, alumina oxide, and tantalum pentoxide.

16. The resonance device according to claim 13, wherein, when a thickness of the protective film is defined as T, $T \leq 116/X$.

* * * * *